United States Patent [19]

Kaiser et al.

[11] Patent Number: 5,297,157
[45] Date of Patent: Mar. 22, 1994

[54] DRIVER CIRCUIT FOR A LASER

[75] Inventors: Norbert Kaiser, Tamm; Werner Manz, Leinfelden-Echterd, both of Fed. Rep. of Germany

[73] Assignee: Alcatel N.V., Amsterdam, Netherlands

[21] Appl. No.: 34,692

[22] Filed: Mar. 19, 1993

[30] Foreign Application Priority Data

Mar. 27, 1992 [DE] Fed. Rep. of Germany ....... 4210022

[51] Int. Cl.$^5$ ............................................. H01S 3/00
[52] U.S. Cl. ....................................... 372/38; 372/29; 372/26
[58] Field of Search ............................. 372/38, 29, 26

[56] References Cited

U.S. PATENT DOCUMENTS

| | | | |
|---|---|---|---|
| 4,539,686 | 9/1985 | Bosch et al. | 372/38 |
| 4,995,105 | 2/1991 | Wechsler | 372/38 |
| 5,038,189 | 8/1991 | Fukudome | 372/38 |

FOREIGN PATENT DOCUMENTS

| | | | |
|---|---|---|---|
| 0038281 | 4/1978 | Japan | 372/38 |
| 3508034 | 9/1986 | Japan | 372/38 |

OTHER PUBLICATIONS

Rein, "Multi-Gigabit-Per-Second Silicon Bipolar IC's for Future Optical-Fiber Transmission Systems", IEEE Journal of Solid-State Circuits, vol. 23, No. 3, Jun. 1988, pp. 664–675.

Yamashita et al., "Master-Slice Monolithic Integration Design and Characteristics of LD/LED Transmitters for 100-400 Mbit/s Optical Transmission Systems", Journal of Lightwave Technology, vol. LT-4, No. 3, Mar. 1986, pp. 353–359.

Rein et al., "Integrierte Biopolarschaltungen", Springer-Verlag, Berlin, Heidelberg, 1980, pp. 100–105.

*Primary Examiner*—Georgia Y. Epps
*Attorney, Agent, or Firm*—Spencer, Frank & Schneider

[57] ABSTRACT

A driver circuit for a laser includes a first differential amplifier with a first controlled current source, and at least one second differential amplifier with an associated second controlled current source. The at least one second differential amplifier is connected in parallel with the first differential amplifier so that the laser is a common load of the first and the at least one second differential amplifiers. A control circuit controls the current sources based on an external control voltage.

7 Claims, 2 Drawing Sheets

DRIVER CIRCUIT FOR A LASER

BACKGROUND OF THE INVENTION

1. Field of the Invention

The present invention relates to a driver circuit for a laser used as an electrical-to-optical transducer in optical communication systems.

2. Background Information

To modulate the laser, use is commonly made of a differential amplifier. Below the so-called threshold current, the laser acts like a light-emitting diode, and the optical output power in this current range is very low. Above the threshold current, lasing occurs, and the optical output power $P_{opt}$ increases linearly with increasing modulating current $I_{mod}$. The rise of the function $P_{opt} = f(I_{mod})$ is dependent on the laser type and specimen used and varies with temperature and aging. To obtain the typical optical output powers specified in the data sheet, a modulating current of $I_{mod} = 5$ mA is required for a 0.8-μm laser of high quantum efficiency and low temperature, for example; for 1.55-μm lasers of moderate quantum efficiency, $I_{mod}$ must be 40 mA.

Prior art driver circuits for lasers employ a differential amplifier which is adapted to the properties of the respective laser and optimized for maximum current, cf. H. M. Rein, "Multi-Gigabit-Per-Second Silicon Bipolar IC's for Future Optical Fiber Transmission Systems", IEEE Journal of Solid-State Circuits, Vol. 23, No. 23, June 1988, pages 664 to 675, and K. Yamashita et al, "Master-Slice Monolithic Integration Design and Characteristics of LD/LED Transmitter for 100-400 Mbit/s Optical Transmission Systems", Journal of Lightwave Technology, Vol. LT-4, No. 3, March 1986, pages 353 to 359. In the solutions described, the optimization for maximum current was performed because the transit frequency of a silicon bipolar transistor depends on the emitter-current density, cf. H.-M. Rein, R. Ranft, "Integrierte Bipolarschaltungen", Springer-Verlag Berlin Heidelberg 1980, pages 100 et seq. The transit frequency decreases with decreasing emitter-current density, and the depletion-layer capacitances and collector-substrate capacitances of the transistor increase with increasing transistor areas. As a result, the optimum bandwidth of the differential amplifier is achieved only within a small current range which depends essentially on the emitter area and corresponds approximately to operation at maximum emitter-current density. If, in such driver circuits, the emitter-current density is reduced by a factor of 10, for example, the influence of the parasitic capacitances on the pulse response will increase so that the bandwidth will be greatly limited and the pulse shape will be substantially degraded. Therefore, such driver circuits are only suitable for lasers with constant properties if no disadvantages in the transient response are to result.

SUMMARY OF THE INVENTION

It is the object of the invention to provide a driver circuit whose pulse response is essentially independent of the modulating-current range.

This object is attained by providing an arrangement with at least one additional differential amplifier. By distributing the modulating current to several differential amplifiers, the individual differential amplifier can be optimized so that it is always operated near the maximum emitter-current density. In this manner, a pulse response in a required current range is achieved which is better than in the known prior art, i.e., higher bit rates are transmissible, or for a specified pulse response, the adjustable current range can be considerably extended. The driver circuit according to the invention can thus be used to drive different laser types, e.g., a 0.8-μm laser or a 1.55-μm laser, without having to reduce the transmission rate. Adaptation to changes in characteristics of the lasers due to temperature changes and aging of the lasers is also possible. The number of differential amplifiers required is determined by the respective application. The individual differential amplifiers are activated via a control circuit depending on the current swing to be processed. The control voltage can be digital, but it is also possible to operate with an analog control voltage and vary the current swing continuously. The driver circuit can be readily implemented with different types of differential amplifiers. For example, the transistor stages of the differential amplifiers may consist of single transistors connected in parallel; a feedback circuit in the emitter branch is also possible. With the solution according to the invention, a universally applicable driver circuit is provided which is suitable for monolithic integration.

BRIEF DESCRIPTION OF THE DRAWINGS

An embodiment of the invention will now be explained with reference to the accompanying drawings, in which.

DETAILED DESCRIPTION OF A PREFERRED EMBODIMENT

Figure 1:
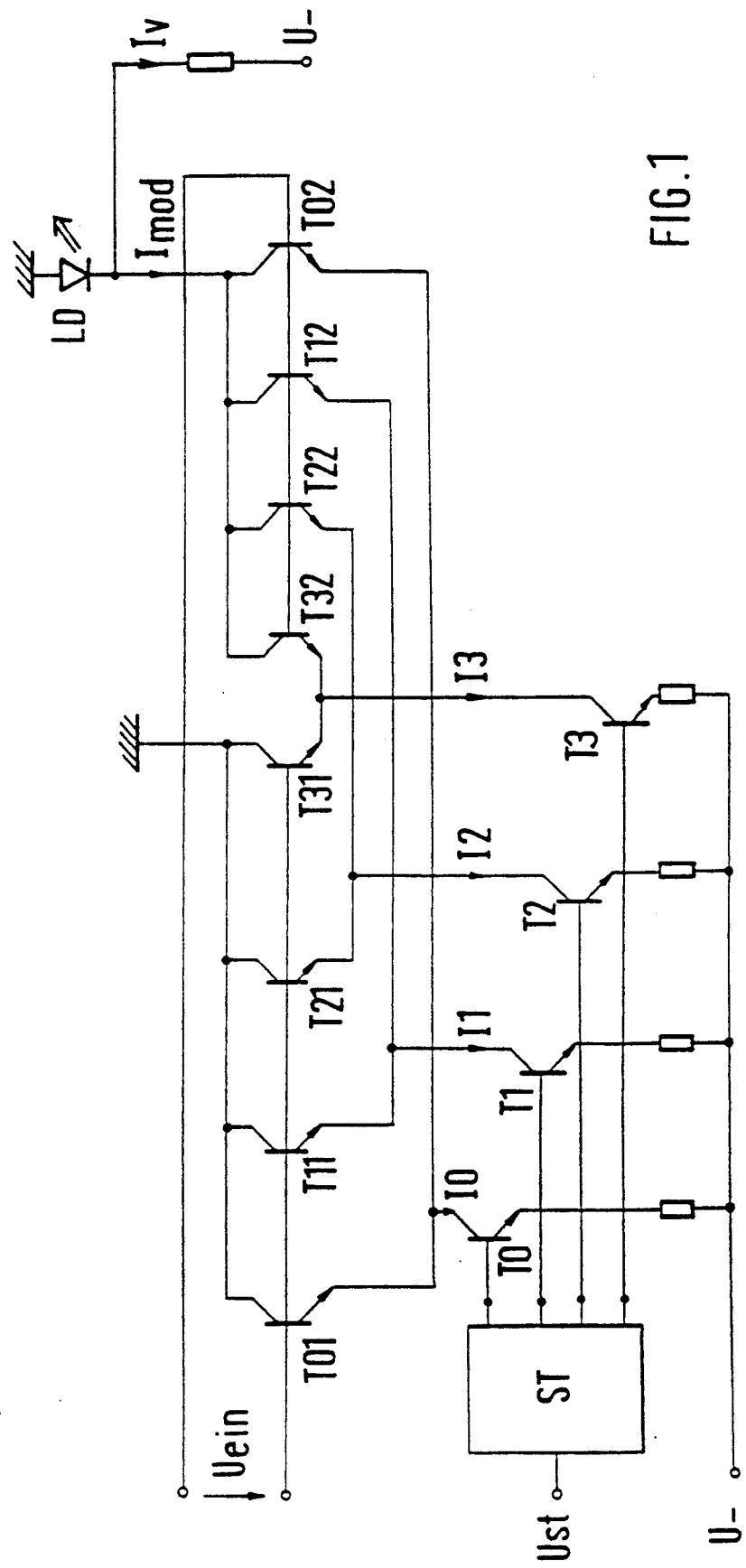
FIG. 1 shows an arrangement of the driver circuit.

As shown in FIG. 1, the circuit consists of a first differential amplifier T01, T02 with a laser diode LD in an output line and further differential amplifiers T11, T12; T21, T22; T31, T32, which are connected in parallel with the first differential amplifier. The emitter lead of each of the differential amplifiers contains a series combination of a current-source transistor T0, T1, T2, T3 and a resistor, this series combination forming a current source. The control input of each of the current sources with the currents I0, I1, I2, I3 is connected to one output of a control circuit ST. Also indicated is a circuit which supplies the laser diode LD with a bias current $I_v$ and input voltage $U_{ein}$ applied to the inputs of each differential amplifier T11, T12; T21, T22; T31, T32.

At a small modulating current $I_{mod}$, e.g., $I_{mod} \leq 5$ mA, only the first current source I0 of the first differential amplifier T01, T02 is switched on. Thus, at this minimum modulating current $I_{mod}$, only one differential amplifier T01, T02 is operated, whose transistors can be optimally adapted to this current. For $5 \text{ mA} \leq I_{mod} \leq 17$ mA, the second current source I1 of the second differential amplifier T11, T12 is switched on, which is controllable within the range $0 \leq I1 \leq 12$ mA, the desired current I1 being determined via the control circuit ST by the magnitude of the control voltage $U_{st}$. At small currents I1 delivered by the second differential amplifier T11, T12, e.g., in the range $0 \leq I1 \leq 5$ mA, the pulse response of the driver circuit is determined essentially by the first differential amplifier T01, T02 with the first current source I0. In the upper current range of the second current source I1 of the second differential amplifier T11, T12, i.e., in the range 5 mA$\leq$I1$\leq$12 mA, this amplifier is operated near the optimum operating range of the transistors, since the latter are designed to carry the current I1$_{max}$=12 mA.

As modulating-current requirements increase, the third current source I2, associated with the third differential amplifier T21, T22, and the fourth current source I3, associated with the fourth differential amplifier T31, T32, are switched on, so that at the maximum modulating current I$_{mod}$, all current sources I0, I1, I2, I3 are switched on.

The current is thus distributed to the four differential amplifiers. Already with a distribution of the modulating current to two differential amplifiers, the pulse response of the circuit is better than that of the prior art circuits.

Figure 2:
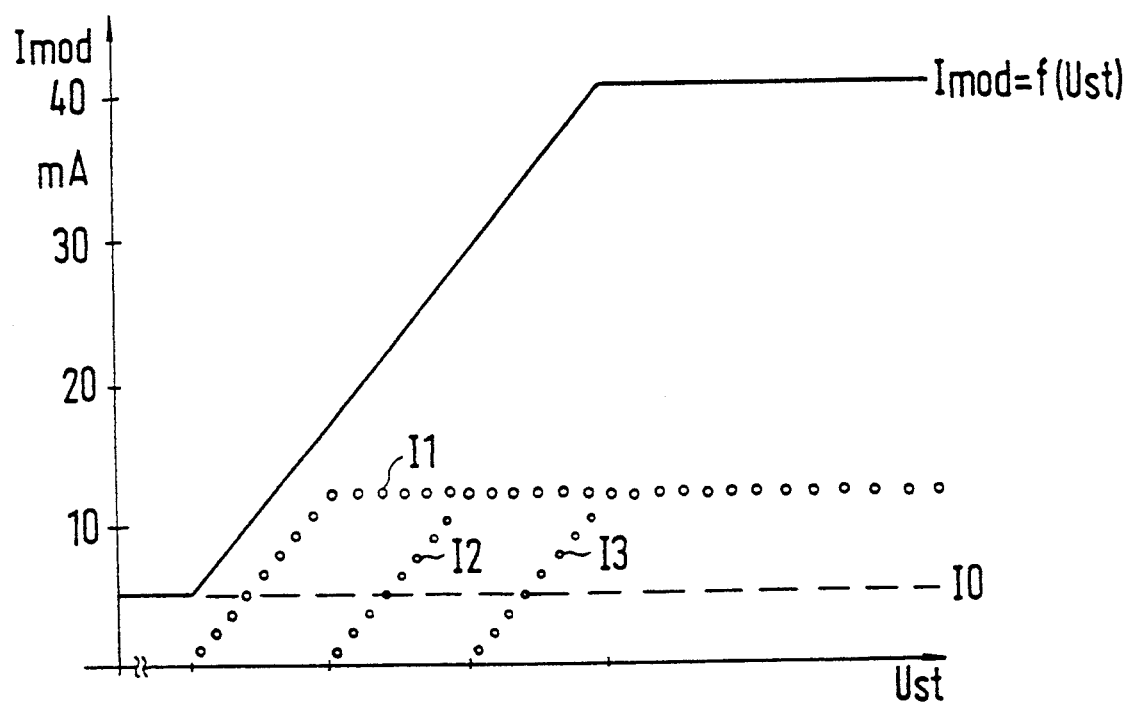
FIG. 2 is a diagram showing the function $$I_{mod} = f(U_{st}).$$

FIG. 2 shows the dependence of the modulating current I$_{mod}$ on the control voltage U$_{st}$ with the current shares of the individual current sources switched on under control of the control voltage U$_{st}$. As an example, FIG. 2 shows I0=5 mA and the three further current sources I1=I2=I3=12 mA, so that the maximum modulating current I$_{mod}$=41 mA.

The adaptation of the differential amplifiers for optimum current can be implemented in various ways. For example, the modulating current I$_{mod}$ can also be distributed to the individual differential amplifiers nonuniformly. The first current source I0 need not be adjusted to the minimum modulating current but may also cover a larger current range and be controllable. It is also possible to provide a control circuit for I0 to In which changes the current share of each current source with small control-voltage changes, in which case the control ranges of the individual current sources may overlap or coincide.

We claim:

1. A driver circuit for a laser, said driver circuit comprising:
    a first differential amplifier with a first controlled current source, first and second outputs of the first differential amplifier being connected through a laser to a first terminal of a voltage source and directly to the first terminal of the voltage source, respectively, an input voltage being applied between first and second inputs of the first differential amplifier, the first differential amplifier being connected through the first controlled current source to a second terminal of the voltage source;
    at least one second differential amplifier with an associated second controlled current source, the at least one second differential amplifier connected in parallel with the first differential amplifier by interconnecting respective first and second inputs and respective first and second outputs, so that the laser is a common load of the first and the at least one second differential amplifiers, the at least one second differential amplifier being connected through the associated second controlled current source to the second terminal of the voltage source; and
    a control circuit for controlling the current sources, respective control inputs of the current sources being coupled to outputs of the control circuit, the control circuit having an input connected to an external control voltage.

2. A driver circuit for a laser as claimed in claim 1, wherein the differential amplifiers contain transistors having emitter areas and wherein the transistors are operated in a region of maximum emitter-current density.

3. A driver circuit for a laser as claimed in claim 1, wherein the external control voltage is digital and the current sources are thereby controlled digitally.

4. A driver circuit for a laser as claimed in claim 1, wherein the control circuit produces the control voltage dependent on laser modulating current requirements, each of the differential amplifiers with their associated current sources providing a portion of a total modulating current to the laser, whereby an improved pulse response in a greater current range is achieved.

5. A driver circuit for a laser as claimed in claim 1, wherein the external control voltage is analog and the current sources are thereby controlled continuously.

6. A driver circuit for a laser as claimed in claim 1, wherein the at least one second differential amplifier with an associated second controlled current source comprises three parallel connected differential amplifiers and associated current sources, there being first, second, third and fourth differential amplifiers connected in parallel and having associated respective first, second, third and fourth controlled current sources; and
    wherein the control circuit controls the four differential amplifiers and associated current sources so that a first laser modulating current range is provided by switching on only the first differential amplifier and the first current source, a second laser modulating current range is provided by switching on the first and second differential amplifiers and current sources, a third laser modulating current range is provided by switching on the first, second and third differential amplifiers and current sources, and a fourth laser modulating current range is provided by switching on the first, second, third and fourth differential amplifiers and current sources.

7. A driver circuit for a laser as claimed in claim 6, wherein the first laser modulating current range is from 5 ma to 12 ma, the second laser modulating current range is from 12 ma to 17 ma, the third laser current range is from 17 ma to 29 ma, and the fourth laser modulating current range is from 29 ma to 41 ma.

* * * * *